(12) United States Patent
Li et al.

(10) Patent No.: US 10,790,379 B1
(45) Date of Patent: Sep. 29, 2020

(54) VERTICAL FIELD EFFECT TRANSISTOR WITH ANCHOR

(71) Applicant: International Business Machines Corporation, Armonk, NY (US)

(72) Inventors: Juntao Li, Cohoes, NY (US); Ruilong Xie, Niskayuna, NY (US); Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/406,579

(22) Filed: May 8, 2019

(51) Int. Cl.
*H01L 29/66* (2006.01)
*H01L 27/088* (2006.01)
*H01L 29/78* (2006.01)
*H01L 21/306* (2006.01)

(52) U.S. Cl.
CPC ...... *H01L 29/66666* (2013.01); *H01L 27/088* (2013.01); *H01L 29/6653* (2013.01); *H01L 29/6656* (2013.01); *H01L 29/66553* (2013.01); *H01L 29/7827* (2013.01); *H01L 21/30604* (2013.01)

(58) Field of Classification Search
CPC .......... H01L 29/66666; H01L 29/6656; H01L 29/66553; H01L 29/7827; H01L 29/6653; H01L 27/088; H01L 21/30604
See application file for complete search history.

(56) References Cited

U.S. PATENT DOCUMENTS

| | | | |
|---|---|---|---|
| 7,078,298 B2 | 7/2006 | Lee et al. | |
| 9,209,094 B2 | 12/2015 | Cheng et al. | |
| 9,349,863 B2 | 5/2016 | Basker et al. | |
| 9,614,087 B1 | 4/2017 | Cheng et al. | |
| 9,755,073 B1* | 9/2017 | Cheng | H01L 29/42392 |
| 9,793,401 B1 | 10/2017 | Balakrishnan et al. | |
| 9,960,254 B1 | 5/2018 | Bao et al. | |
| 2013/0154029 A1* | 6/2013 | Cai | H01L 29/7848 257/402 |
| 2017/0222045 A1 | 8/2017 | Leobandung | |
| 2017/0229558 A1* | 8/2017 | Anderson | H01L 21/3086 |
| 2018/0005834 A1 | 1/2018 | Cheng et al. | |
| 2018/0006151 A1 | 1/2018 | Bergendahl et al. | |
| 2018/0096996 A1* | 4/2018 | Bi | H01L 27/0886 |

* cited by examiner

*Primary Examiner* — Syed I Gheyas
(74) *Attorney, Agent, or Firm* — Vazken Alexanian; Ryan, Mason & Lewis, LLP

(57) ABSTRACT

A method for fabricating a semiconductor structure is provided. The method includes forming one or more vertical fins on a semiconductor substrate with a hardmask on a top surface of the one or more vertical fins. The method includes forming an opening in the hardmask and the one or more vertical fins and in a portion of the semiconductor substrate to form a plurality of vertical fins. The method includes depositing an anchor layer in the opening. The method includes depositing a liner layer on sidewalls of each of the vertical fins and above a top surface of the semiconductor substrate. The method includes forming an angled recessed region in the exposed portion of each of the vertical fins below the liner layer and in the semiconductor substrate. The method includes forming a bottom source/drain region in the angled recessed region.

20 Claims, 12 Drawing Sheets

VERTICAL FIELD EFFECT TRANSISTOR WITH ANCHOR

BACKGROUND

Vertical transport field effect transistors (VFETs) are becoming viable device options for semiconductor devices beyond the so-called "seven nanometer (7 nm) node." VFET devices include fin channels with source/drain regions at ends of the fin channels, i.e., on tops and bottoms of the fins. Current flows through the fin channels in a vertical direction (e.g., perpendicular to a substrate), for example, from a bottom source/drain region to a top source/drain region. VFET devices are designed to address the limitations of horizontal device architectures, for example, by decoupling gate length from the contact gate pitch, providing a FinFET-equivalent density at a larger contacted poly pitch (CPP), and providing lower middle-of-the-line (MOL) resistance.

SUMMARY

Embodiments described herein provide methods of forming semiconductor devices.

For example, one exemplary embodiment includes a method for fabricating a semiconductor device. The method comprises forming one or more vertical fins on a semiconductor substrate with a hardmask on a top surface of the one or more vertical fins. The method further comprises forming an opening in the hardmask and the one or more vertical fins and in a portion of the semiconductor substrate to form a plurality of vertical fins. The method further comprises depositing an anchor layer in the opening. The method further comprises depositing a liner layer on sidewalls of each of the vertical fins and above a top surface of the semiconductor substrate. The method further comprises forming an angled recessed region in the exposed portion of each of the vertical fins below the liner layer and in the semiconductor substrate. The method further comprises forming a bottom source/drain region in the angled recessed region.

Another exemplary embodiment includes a semiconductor device which comprises a plurality of vertical fins on a semiconductor substrate. Each of the vertical fins has a top portion, a central portion and a bottom portion. The thickness of the top portion and the bottom portion is greater than the thickness of the central portion. The semiconductor device further comprises a shallow trench region comprising an anchor material disposed between adjacent vertical fins having a first bottom spacer layer on a top surface thereof. The semiconductor device further comprises a bottom source/drain region disposed in an angled recess region in an outer portion of the bottom portion of each of the adjacent vertical fins and in the semiconductor substrate. The semiconductor device further comprises a second bottom spacer layer disposed on a portion of a top surface of the bottom source/drain region. The semiconductor device further comprises a replacement metal gate disposed on a portion of first and second bottom spacer layers and in contact with the central portion of each of the vertical fins. The semiconductor device further comprises a top source drain region disposed on a top surface of each of the vertical fins. The semiconductor device further comprises an inner spacer disposed on a portion of a top surface of the replacement metal gate and in contact with a portion of top portion of each of the vertical fins and sidewalls of the top source drain region. The semiconductor device further comprises an interlevel dielectric layer disposed on a top surface of the second bottom spacer layers and in contact with sidewalls of the replacement metal gate and the inner spacer and above a top surface of the inner spacer. The semiconductor device further comprises metal contacts to electrically couple respectively with the replacement metal gate, the top source/drain region, and the bottom source/drain region.

These and other features, objects and advantages of the present invention will become apparent from the following detailed description of illustrative embodiments thereof, which is to be read in connection with the accompanying drawings.

DETAILED DESCRIPTION

The present application relates generally to transistors, and more particularly to vertical fin-shaped field effect transistors (VFETs) and methods for their fabrication.

As discussed above, VFETs are becoming viable device options for semiconductor devices beyond the so-called "seven nanometer (7 nm) node." However, during fabrication of these transistors it is difficult to form an aligned bottom junction since there is no guarantee that etching of the fins stops at the edge of the highly doped source/drain layer. In addition, after the fin formation, the regions between vertical fins may then be recessed to form a bottom source/drain recess for later bottom/source drain epitaxial growth. Furthermore, a lateral etch may also be performed to trim the fin bottom as well to keep the bottom source/drain epitaxy close to the channel region to achieve sharp junctions. Thus, the resulting fins have a wide top portion but a small fin bottom channel thereby leading to stability issues. Accordingly, it would be desirable to fabricate a VFET which possesses an anchor during the source/drain recess and bottom lateral etching process to maintain fin stability.

In illustrative embodiments, techniques are provided for fabricating semiconductor devices comprised of one or more VFETs. As will be explained in illustrative embodiments, such fabrication techniques advantageously improve the fabrication of semiconductor devices.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the cross-sectional views, and "horizontal" refers to a direction parallel to the top surface of the substrate in the cross-sectional views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop" or the term "direct contact" mean that a first element and a second element are connected without any intervening elements, such as, for example, intermediary conducting, insulating or semiconductor layers, present between the first element and the second element.

Figure 1A:
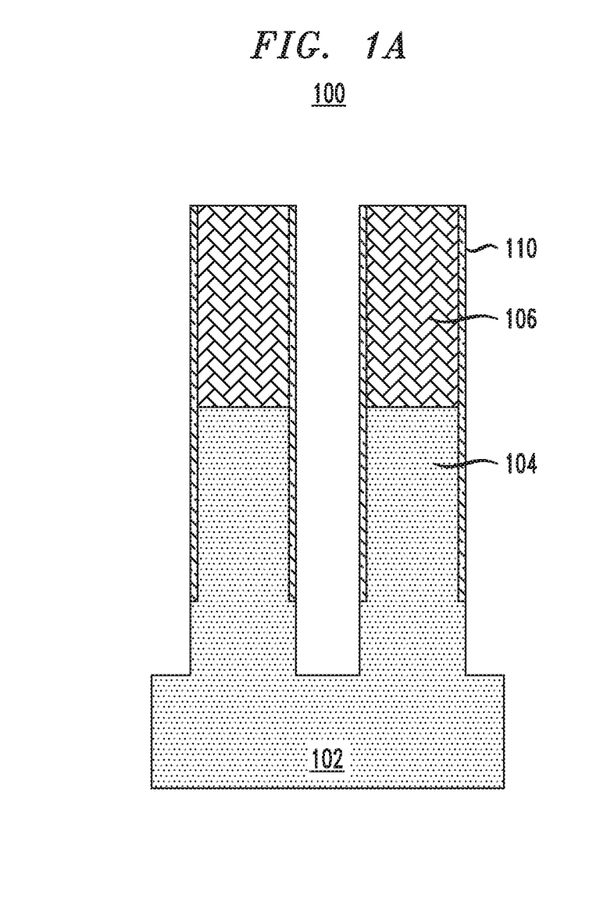
FIG. 1A is a cross sectional view of a semiconductor device through the fin width at a first-intermediate fabrication stage, according to an illustrative embodiment.

An illustrative embodiment for forming a semiconductor device will be described below with reference to FIGS. 1A-12B. Note that the same reference numeral (100) is used to denote the semiconductor structure through the various intermediate fabrication stages illustrated in FIGS. 1A through 12B. Note also that semiconductor structure described herein can also be considered to be a semiconductor device and/or an integrated circuit, or some part thereof. For the purpose of clarity, some fabrication steps leading up to the production of the semiconductor structure as illustrated in FIGS. 1A and 12B are omitted. In other words, one or more well-known processing steps which are not illustrated but are well-known to those of ordinary skill in the art have not been included in the figures.

Figure 1B:
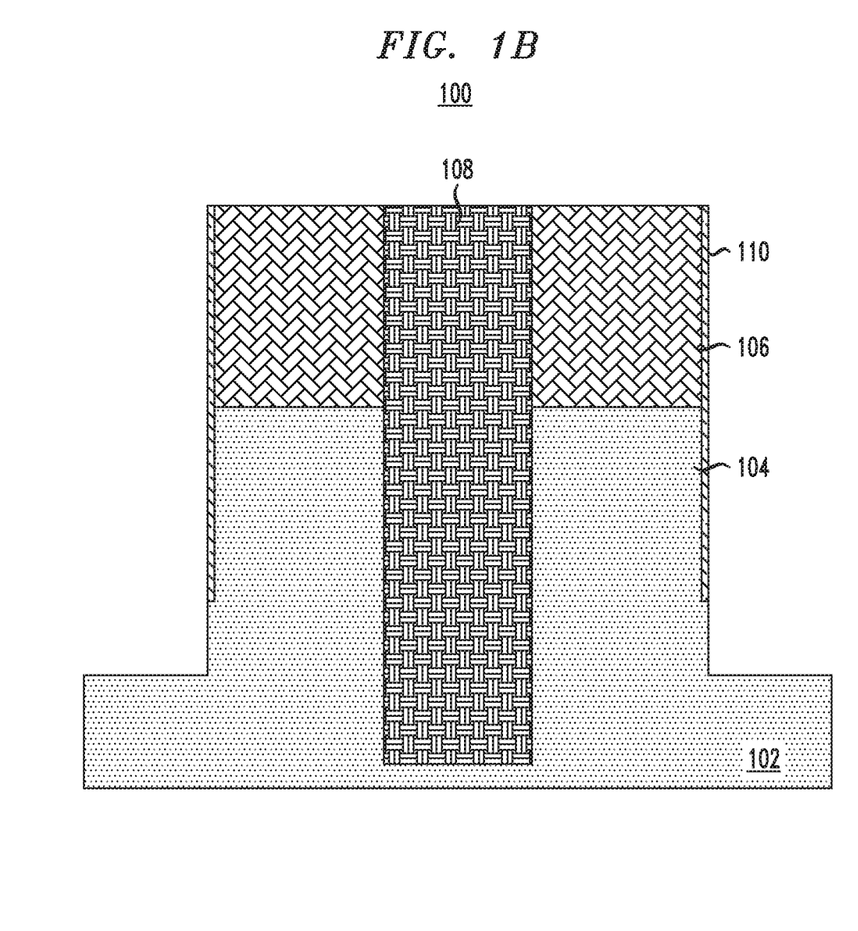
FIG. 1B is a cross sectional view of the semiconductor device of FIG. 1A through the fin length at the first-intermediate fabrication stage, according to an illustrative embodiment.

FIG. 1A illustrates a cross-sectional view of semiconductor structure 100 through the fin width at a first-intermediate fabrication stage, and FIG. 1B is a cross sectional view of the semiconductor device of FIG. 1A through the fin length at the first-intermediate fabrication stage. Semiconductor structure 100 in FIGS. 1A and 1B is shown comprising vertical fin 104 formed from semiconductor substrate 102. In one embodiment, the semiconductor substrate 102 is comprised of silicon (Si). In another embodiment, the semiconductor substrate is comprised of a group III-V compound or a group II-V compound. However, the semiconductor substrate may be comprised of any material suitable for use in accordance with the embodiments described herein.

Vertical fin 104 further includes a hardmask 106 such as silicon nitride for carrying out a fin cutting pattern as shown in FIG. 1B. The vertical fins are cut using an optical planarization layer (OPL) (not shown) that is deposited on substrate 102 and over fins 104 and hardmask 106. A shallow trench isolation (STI) region is then formed in substrate 102 and between fins 104. In one embodiment, the starting vertical fin 104 before the fin cut patterning will have a thickness ranging from about 6 to about 10 nm or about 7 to about 8 nm. However, this is merely exemplary and other fin thicknesses are contemplated herein. Next, an anchor layer 108, is deposited in the opening between fins 104 and in the STI region. The anchor layer 108 advantageously acts as an anchor to provide stability for the fins 104 for subsequent processing steps as discussed below, e.g., for formation of the bottom source/drain region. The anchor layer 108 can be formed from, for example, a low temperature oxide. The OPL layer (not shown) is removed by conventional techniques.

Next, the sidewalls of fins 104 and hardmask 106 are recessed to a portion above the top surface of substrate 102 by conventional techniques, e.g., a directional etching technique. A conformal liner layer 110 (e.g., silicon nitride) is deposited on the sidewalls of fins 104 and hardmask 106 and in contact with the exposed unrecessed portion of the sidewalls of fins 104.

Figure 2A:
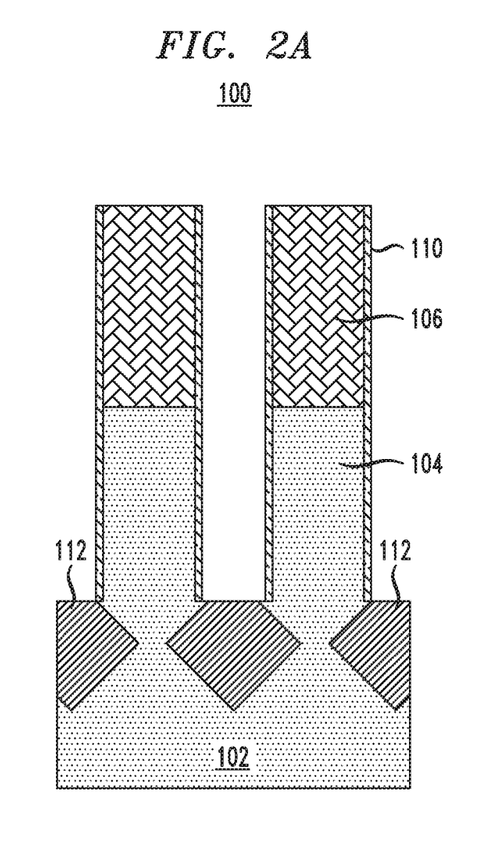
FIG. 2A is a cross sectional view of a semiconductor device through the fin width at a second-intermediate fabrication stage, according to an illustrative embodiment.
Figure 2B:
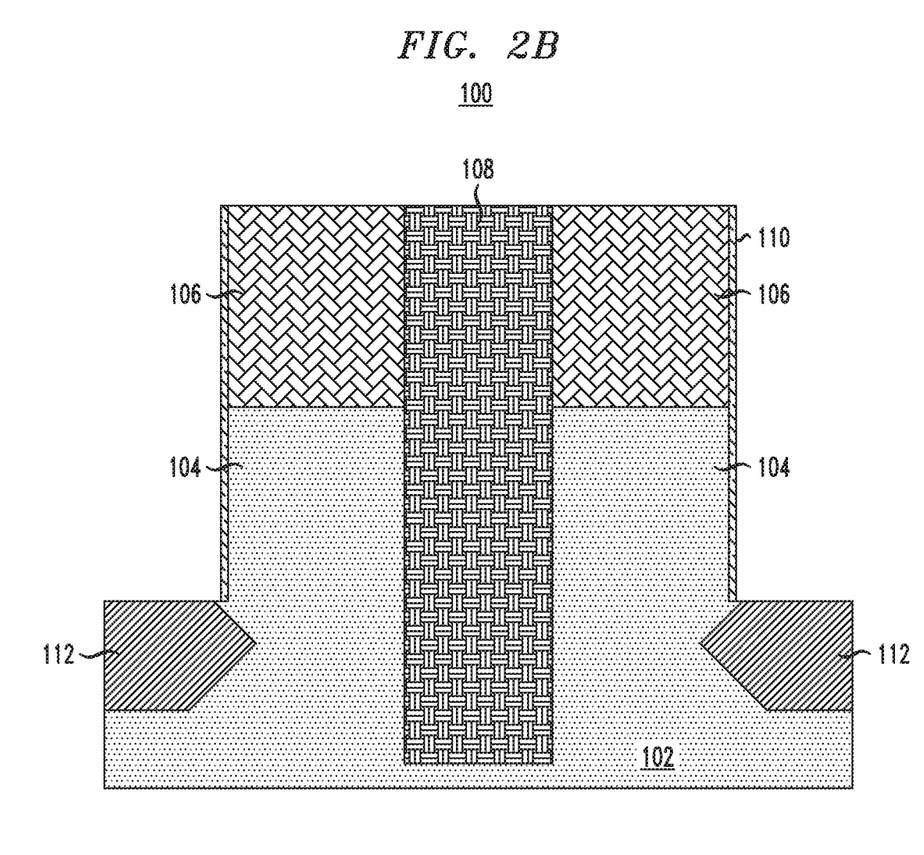
FIG. 2B is a cross sectional view of the semiconductor device of FIG. 2A through the fin length at the second-intermediate fabrication stage, according to an illustrative embodiment.

FIG. 2A illustrates a cross-sectional view of semiconductor structure 100 through the fin width at a second-intermediate fabrication stage, and FIG. 2B is a cross sectional view of the semiconductor device of FIG. 2A through the fin length at the second-intermediate fabrication stage. During this stage, a bottom source/drain region is formed on and in contact with the substrate 102 (or counter-doped layer if formed). The substrate 102 may be anisotropically recessed to form bottom source/drain regions 112. The source/drain regions 112 may take on any shape such as, for example, a diamond shape or a region with a substantially flat bottom. Additionally, the bottom source/drain regions 112 may be an angled recessed region as shown in FIG. 2A. As one skilled in the art will appreciate a substantially precise placement of the angled recessed region may be beneficial to device performance, as small (about 0.1 nm) changes could lead to relatively large changes in voltage across the channel. The substrate 102 may be etched to form the angled recessed corner beneath the fins 104. The angled recessed region may be v-shaped, as depicted in FIG. 2A. In other embodiments, the angled recessed region may have a sigma-shaped recess, with an approximately vertical sidewall connecting the two angled faces of the recess (not shown).

In one embodiment, bottom source/drain regions 112 are formed by performing a sigma etch. Sigma etching is synonymous with the terms "crystallographic etching" and "anisotropic etching along crystal planes. Sigma etching includes utilizing a chemical etchant. Suitable chemical etchants that can be used for the sigma etch include, for example, hydroxides such as potassium hydroxide, and tetraethylammonium hydroxide, or an aqueous solution of ethylene diamine and pyrocatechol.

Prior to etching, the substrate 102 may have a <110> crystal lattice structure, which will etch faster than planes having a <111> crystal lattice structure. As the etch progresses, the <110> plane of the substrate 102 may be etched away to expose <111> planes angled inward away from the substrate 102. These <111> planes may form the boundary of the angled recess region. If the etch proceeds to the point where the <111> planes intersect, then the angled recess region may be v-shaped. Otherwise, the angled recess region may be sigma-shaped.

Bottom source/drain regions 112 are formed, for example, in the P-FET and N-FET regions, respectively, around the fins 104. However, bottom source/drain regions 112 can be formed in only P-FET regions or N-FET regions around the fins 104. The bottom source/drain regions 112 can be formed by bottom-up epitaxial growth processes up to the bottom surface of liner layer 110 covering fin sidewalls during epitaxial growth. The bottom source/drain regions 112 are grown in separate or simultaneous epitaxial processes from each other to a desired height (thickness) such as, for example, about 10 nm to about 50 nm. The epitaxially grown bottom source/drain regions 112 can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1\times10^{18}/cm^3$ to $1\times10^{21}/cm^3$. According to an embodiment, the bottom source/drain regions 112 can include a boron doped SiGe, or a phosphorous doped silicon. In embodiments in which the sigma shaped source/drain is close to the fin channel bottom, a sharp junction can be provided between the sigma shaped source/drain and semiconductor fin channel. The sharp junction may result in improved electrostatics and external resistance.

Terms such as "epitaxial growth and/or deposition" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Examples of various epitaxial growth processes include, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Figure 3:
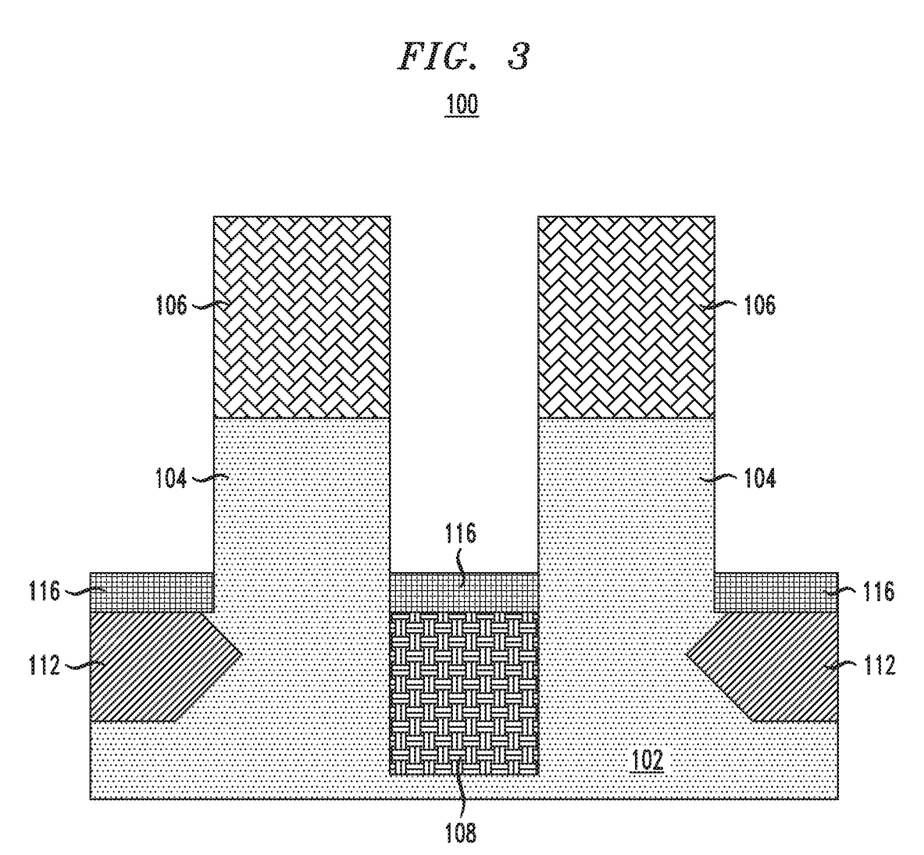
FIG. 3 is a cross sectional view of a semiconductor device through the fin length at a third-intermediate fabrication stage, according to an illustrative embodiment.

FIG. 3 illustrates a cross-sectional view of semiconductor structure 100 at a third-intermediate fabrication stage. During this stage, a directional etch technique such as, for example, RIE, is carried out through a portion of anchor layer 108 until the top surface of oxide layer is coplanar with the top surface of bottom source/drain regions 112. Next, the liner layer 110 is removed utilizing an isotropic etching process that selectivity removes the liner layer 110 and exposes the top surface of bottom source/drain regions 112. The isotropic etch may be a wet or dry etch that is selective to the material in liner layer 110.

Bottom spacer layers 116 are then formed in contact with each of the fins 104, as shown in FIG. 3. The bottom spacer layers 116 include a bottom surface of one bottom spacer layer 116 in contact with the top surface of anchor layer 108, and another bottom spacer layer 116 in contact with the top surface of the bottom source/drain regions 112. The bottom spacer layer 116 also contacts sidewalls of the fins 104. Suitable material for bottom spacer layers 116 includes, for example, an insulating material such as silicon oxide, silicon nitride, silicon oxynitride, or a combination of these. The bottom spacer layers 116 are formed using any non-conformal deposition process such as, for example, high density plasma chemical vapor deposition (HDPCVD), physical vapor deposition (PVD) and subsequent etching techniques. The deposited spacer material may then be subsequently etched to remove the material deposited on vertical sidewalls and form the final spacer structure. In one embodiment, bottom spacer layers 116 can have a thickness of, for example, about 4 nm to about 20 nm or from about 5 to about 10 nm.

Figure 4:
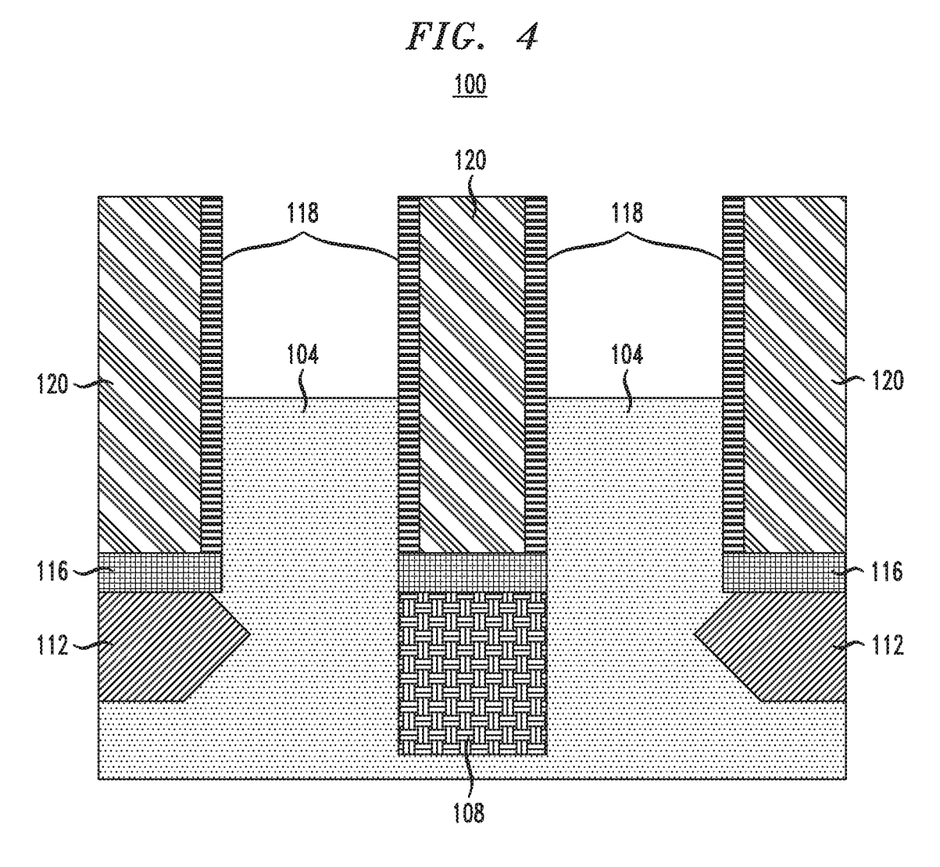
FIG. 4 is a cross sectional view of a semiconductor device through the fin length at a fourth-intermediate fabrication stage, according to an illustrative embodiment.

FIG. 4 illustrates a cross-sectional view of semiconductor structure 100 at a fourth-intermediate fabrication stage. During this stage, a dummy gate 118 is formed by first depositing a thin dielectric layer (not shown) on bottom spacer layers 116 and on the sidewalls of fins 104 and hardmask 106, followed by a dummy gate material deposition. The dummy gate structure 118 includes a suitable dummy gate material such as polysilicon or amorphous silicon. The formation of the dummy gate structure 118 is well known to one skilled in the art of finFET and replacement metal gate (RMG) processes. In one embodiment, the dummy gate dielectric material is silicon dioxide and the dummy gate material is amorphous silicon. The dummy gate 118 can be deposited using a deposition process, such as chemical vapor deposition (CVD), atomic layer deposition (ALD), plasma enhanced chemical vapor deposition (PECVD), metal organic chemical vapor deposition (MOCVD) or other like chemical vapor deposition processes.

Next, an interlevel dielectric (ILD) layer 120 may e deposited on bottom spacer layers 116 and on the sidewalls of dummy gate 118. The ILD layer 120 may include any suitable dielectric material, for example, silicon oxide, silicon nitride, hydrogenated silicon carbon oxide, silicon based low-k dielectrics, flowable oxides, porous dielectrics, or organic dielectrics including porous organic dielectrics. The ILD layer 120 may be formed using any suitable deposition techniques including CVD, PVD, PECVD, ALD, chemical solution deposition or other like processes. The ILD layer 120 may e thinned, for example by a CMP technique, so that a top surface of the ILD layer 120 may be approximately coplanar with a top surface of the dummy gate 118 and the hardmask 108 (not shown). The hardmask 108 is then removed by any suitable etching process known in the art capable of selectively removing the hardmask 108 without substantially removing material from the dummy gate 118 and the ILD layer 120. In an exemplary embodiment, the hardmask 108 may be removed, for example, by a RIE process.

Figure 5:
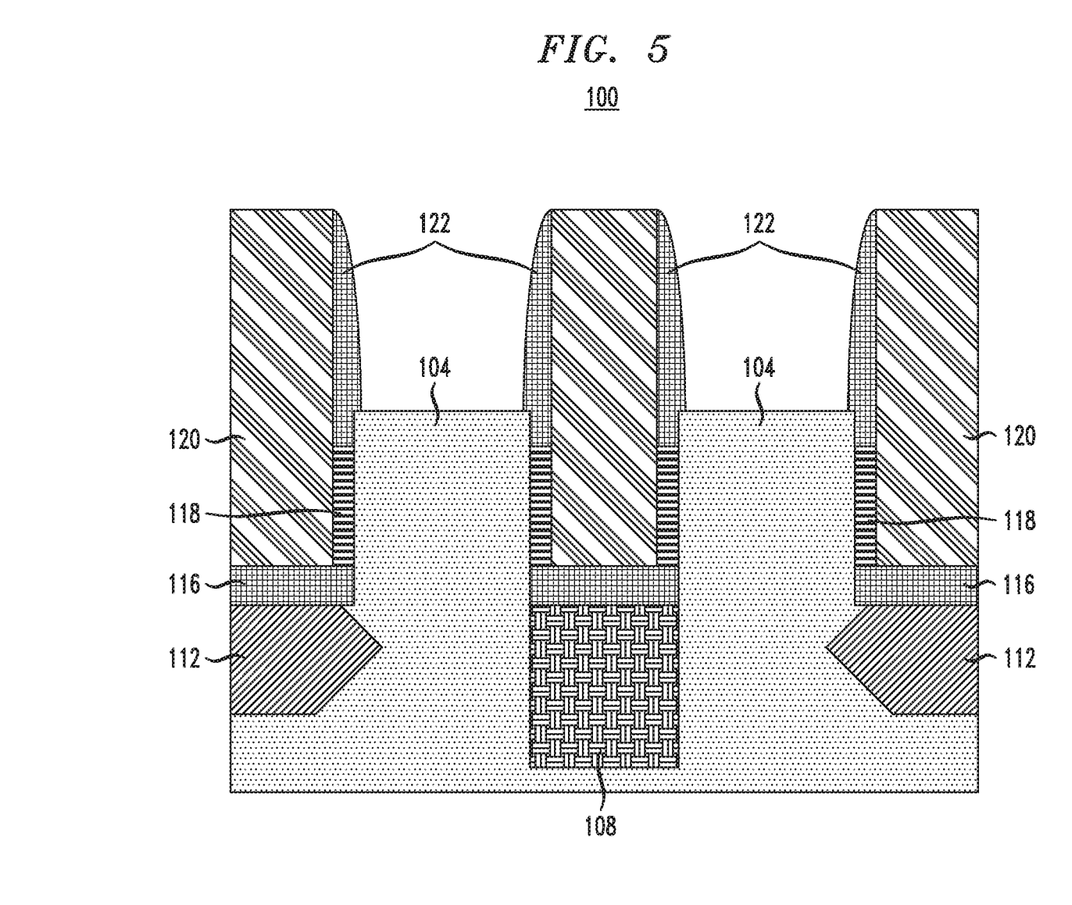
FIG. 5 is a cross sectional view of a semiconductor device through the fin length at a fifth-intermediate fabrication stage, according to an illustrative embodiment.

FIG. 5 illustrates a cross-sectional view of semiconductor structure 100 at a fifth-intermediate fabrication stage. During this stage, the dummy gate layer 118 is removed from the sidewalls of ILD layer 120 and to a portion below the top surface of fin 104. Next, an inner spacer 122 is formed on the sidewalls of ILD layer 120 and fin 104 including the top surface of the remaining portion of dummy gate layer 118. Suitable material for inner spacer 122 includes, for example, a dielectric material such as, for example, silicon oxide, silicon nitride or silicon oxynitride. In one embodiment, the inner spacer 122 is comprised of silicon nitride. The inner spacer 122 can be formed by deposition of a conformal dielectric material layer, followed by anisotropic etching.

Figure 6:
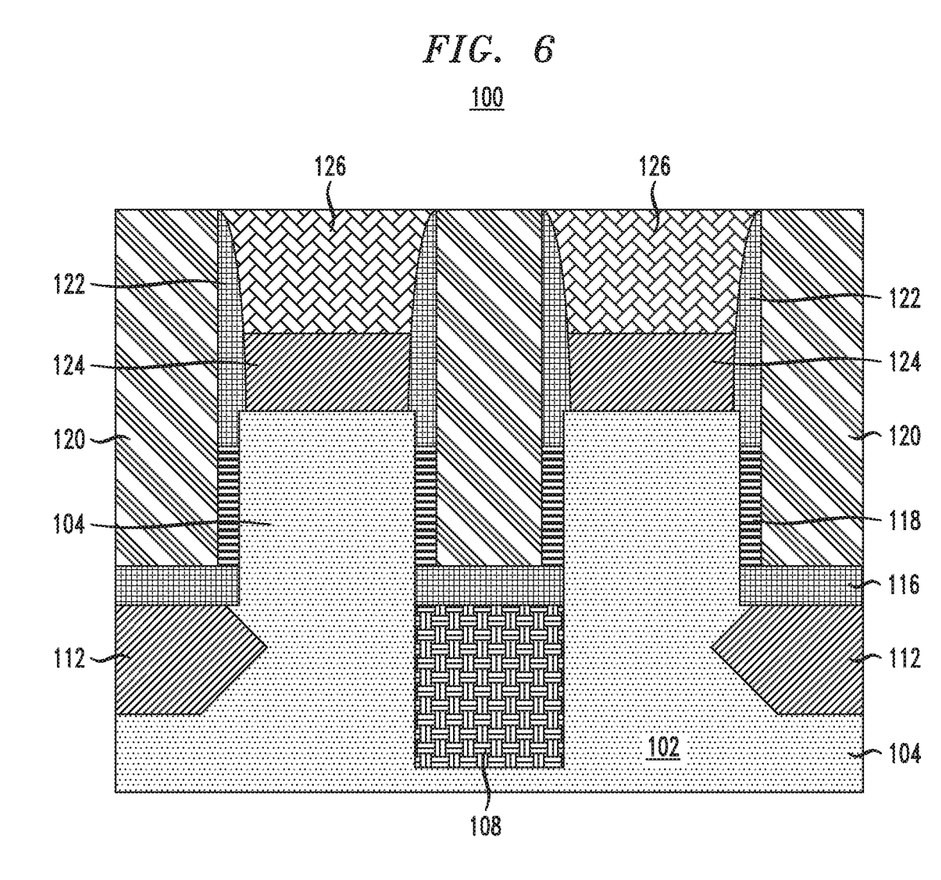
FIG. 6 is a cross sectional view of a semiconductor device through the fin length at a sixth-intermediate fabrication stage, according to an illustrative embodiment.

FIG. 6 illustrates a cross-sectional view of semiconductor structure 100 at a sixth-intermediate fabrication stage. During this stage, top source/drain regions 124 are formed on the top surface of fin 104 and on a portion of the sidewalls of inner spacer 122. The top source/drain regions 124 can be in the n-type region or the p-type region and is epitaxially grown in epitaxial growth processes from the upper portions of the fins 104. The epitaxially grown top source/drain regions 124 can be formed in different epitaxial growth processes from each other and can be in-situ doped. Other alternative doping techniques can be used, including but not limited to, for example, ion implantation, gas phase doping, plasma doping, plasma immersion ion implantation, cluster doping, infusion doping, liquid phase doping, solid phase doping, etc., and dopants may include, for example, any of the n-type dopants and p-type dopants discussed above.

Next, capping layer 126 is deposited on top source/drain regions 124 and then planarized by, for example, CMP. The capping layer 126 comprises, for example, silicon dioxide. The capping layer 126 is a sacrificial layer comprising a different dielectric material than the inner spacer layer 122 and ILD layer 120. As one skilled in the art will understand, capping layer 126 protects the top source/drain regions 124 while the ILD layer 120 is selectively removed as discussed herein below. In addition, capping layer 126 also assists in forming a planar top surface to facilitate further downstream processing.

Figure 7A:
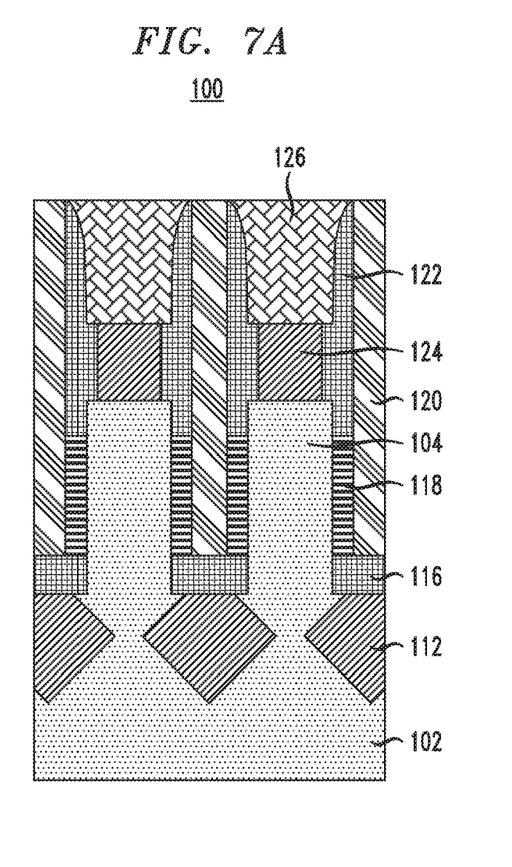
FIG. 7A is a cross sectional view of a semiconductor device through the fin width at a seventh-intermediate fabrication stage, according to an illustrative embodiment.
Figure 7B:
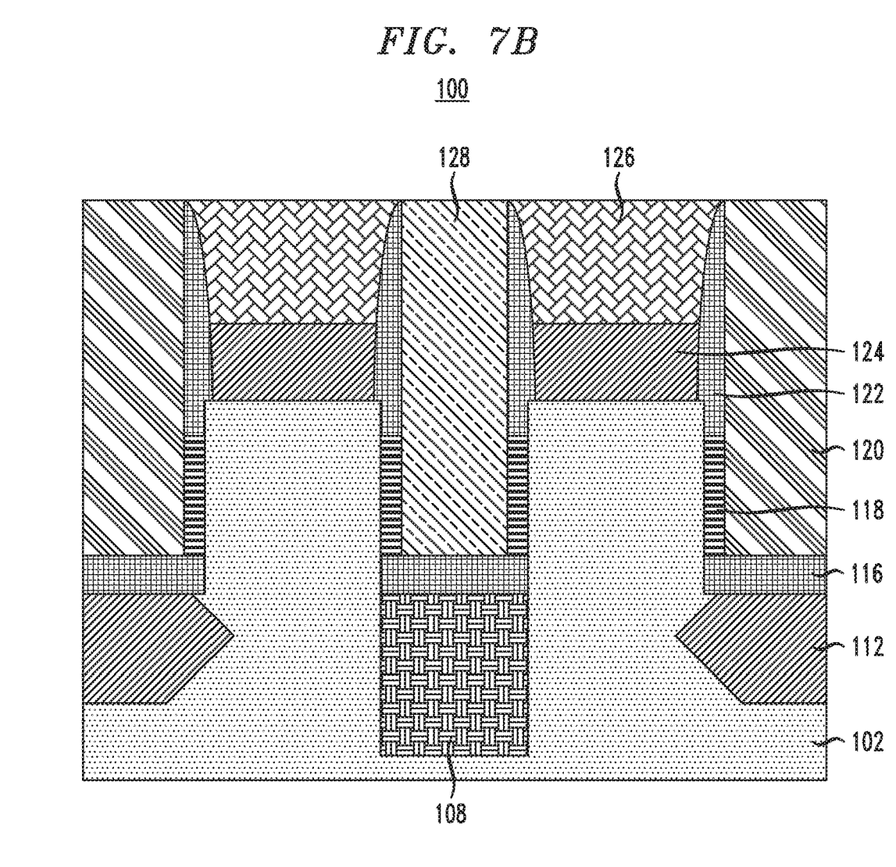
FIG. 7B is a cross sectional view of the semiconductor device of FIG. 7A through the fin length at the seventh-intermediate fabrication stage, according to an illustrative embodiment.

FIG. 7A illustrates a cross-sectional view of semiconductor structure 100 through the fin width at a seventh-intermediate fabrication stage, and FIG. 7B is a cross sectional view of the semiconductor device of FIG. 7A through the fin length at the seventh-intermediate fabrication stage. During this stage, the ILD layer 120 between adjacent fins 104 is selectively removed by such techniques as, for example, RIE, to form an opening (not shown). Next, dielectric layer 128 is deposited in the opening and can comprise any dielectric material including, for example, SiC (silicon carbide), $SiO_2$ or any combination thereof. Dielectric layer 128 should have etch selectivity to ILD layer 120 since the remaining ILD layer 120 will be selectively etched in the next step. Dielectric layer 128 can be deposited by known techniques, e.g., CVD, ALD, or any other suitable technique. Dielectric layer 128 can then be planarized by, for example, CMP.

Figure 8A:
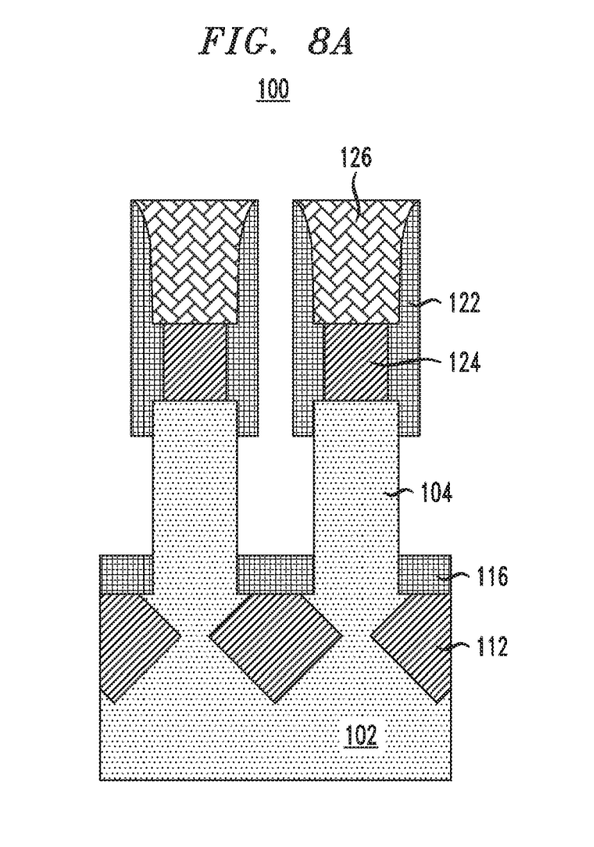
FIG. 8A is a cross sectional view of a semiconductor device through the fin width at an eighth-intermediate fabrication stage, according to an illustrative embodiment.
Figure 8B:
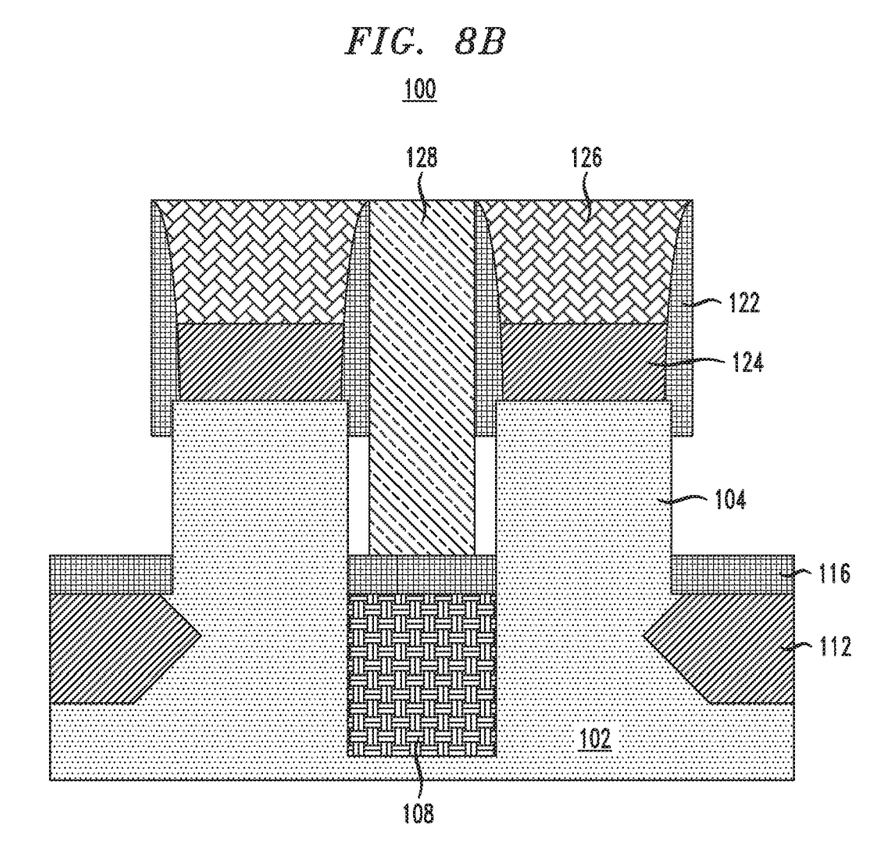
FIG. 8B is a cross sectional view of the semiconductor device of FIG. 8A through the fin length at the eighth-intermediate fabrication stage, according to an illustrative embodiment.

FIG. 8A illustrates a cross-sectional view of semiconductor structure 100 through the fin width at an eighth-intermediate fabrication stage, and FIG. 8B is a cross sectional view of the semiconductor device of FIG. 8A through the fin length at the eighth-intermediate fabrication stage. During this stage, the remaining ILD layer 120 and dummy gate layer 118 are selectively removed by conventional techniques. For example, the remaining ILD layer 120 and dummy gate layer 118 are removed by using a selective directional removal technique that is selective to the capping layer 126, inner spacer layer 122 and dielectric layer 128, for example, a wet or dry isotropic etch.

Figure 9A:
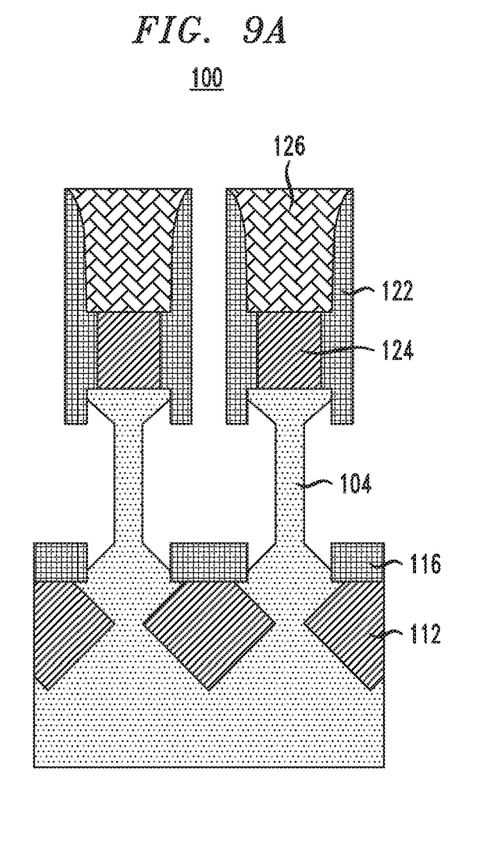
FIG. 9A is a cross sectional view of a semiconductor device through the fin width at a ninth-intermediate fabrication stage, according to an illustrative embodiment.
Figure 9B:
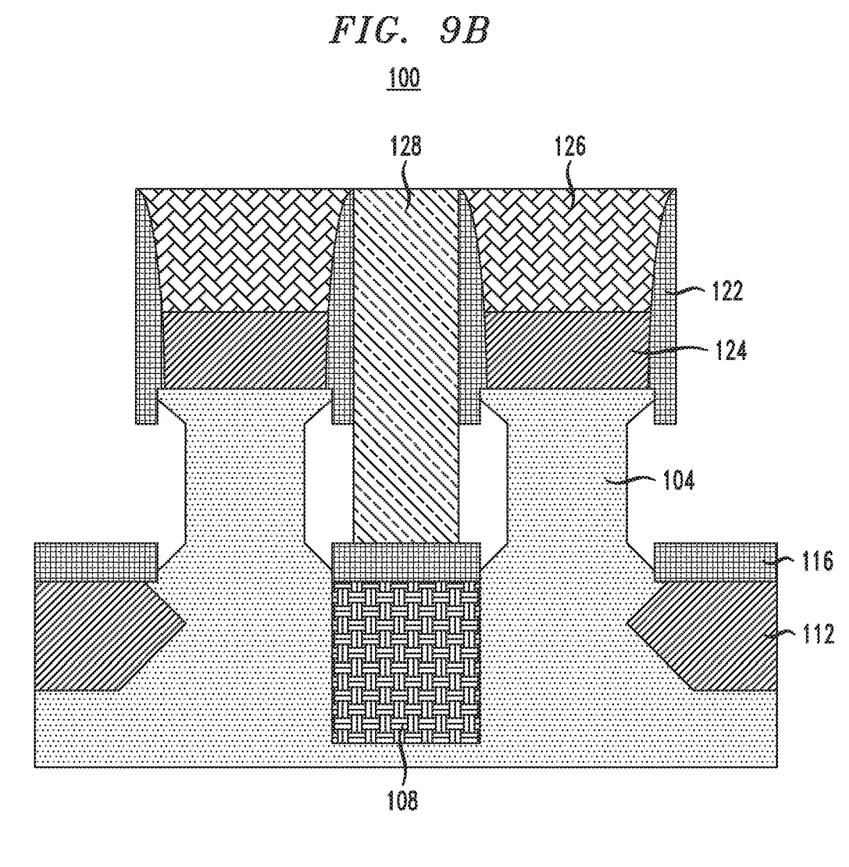
FIG. 9B is a cross sectional view of the semiconductor device of FIG. 9A through the fin length at the ninth-intermediate fabrication stage, according to an illustrative embodiment.

FIG. 9A illustrates a cross-sectional view of semiconductor structure 100 through the fin width at a ninth-intermediate fabrication stage, and FIG. 9B is a cross sectional view of the semiconductor device of FIG. 9A through the fin length at the ninth-intermediate fabrication stage. During this stage, fin 104 is selectively trimmed in a central portion relative to the top and bottom portions of fin 104 such that a portion of inner spacer layer 122 and bottom spacer 116 are not in contact with fin 104 thereby leaving a gap therebetween. The fin 104 can be trimmed selectively by etching. In one embodiment, fin 104 can be trimmed by oxidation and then removing the oxide or by direct etching or atomic layer etching where a repetitive fixed amount of material is removed. In another embodiment, fin 104 can be trimmed by using a wet or dry etch process using, for example, potassium hydroxide or tetramethylammonium hydroxide.

Figure 10A:
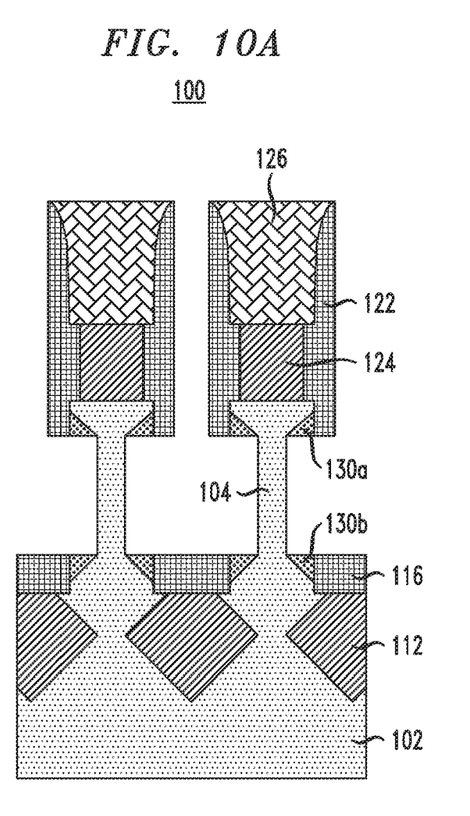
FIG. 10A is a cross sectional view of a semiconductor device through the fin width at a tenth-intermediate fabrication stage, according to an illustrative embodiment.
Figure 10B:
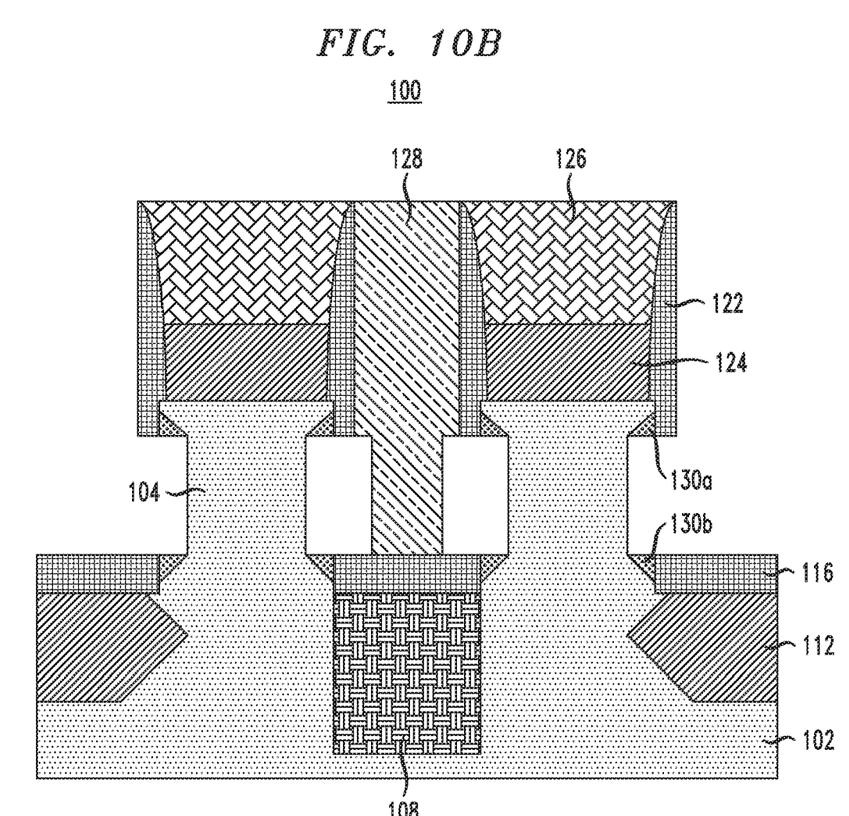
FIG. 10B is a cross sectional view of the semiconductor device of FIG. 10A through the fin length at the tenth-intermediate fabrication stage, according to an illustrative embodiment.

FIG. 10A illustrates a cross-sectional view of semiconductor structure 100 through the fin width at a tenth-intermediate fabrication stage, and FIG. 10B is a cross sectional view of the semiconductor device of FIG. 10A through the fin length at the tenth-intermediate fabrication stage. During this stage, an inner spacer layer 130a is deposited in the gap between fin 104 and inner spacer layer 122 such that the bottom surface of inner spacer layer 130a is planarized with the bottom surface of inner spacer 122. In addition, inner spacer layer 130b is deposited in the gap between fin 104 and bottom spacer 116 such that the top surface of inner spacer layer 130b is planarized with the top surface of bottom spacer 116. Inner spacer layers 130a and 130b can be deposited by any conventional conformal deposition process such as CVD, PVD, PECVD, ALD, chemical solution deposition or other like processes, followed by an isotropic etch back process to remove any conformal spacer material on the exposed surface. As one skilled in the art will understand, this will result in a divot-fill of the spacer material in the gaps as noted hereinabove as inner spacer layers 130a and 130b. Suitable material for inner spacer layers 130a and 130b includes, for example, any suitable dielectric material. Next, the exposed portion of dielectric layer 128 is trimmed to allow for deposition of a work function metal as discussed hereinbelow. The exposed portion of dielectric layer 128 can be laterally trimmed by any of the suitable techniques discussed above for trimming fin 104. This trimming process assists in making sufficient room for the work function metal deposition as described hereinbelow. In addition, the trimming process also allows for an easier gate contact formation to the replacement metal gates.

Figure 11A:
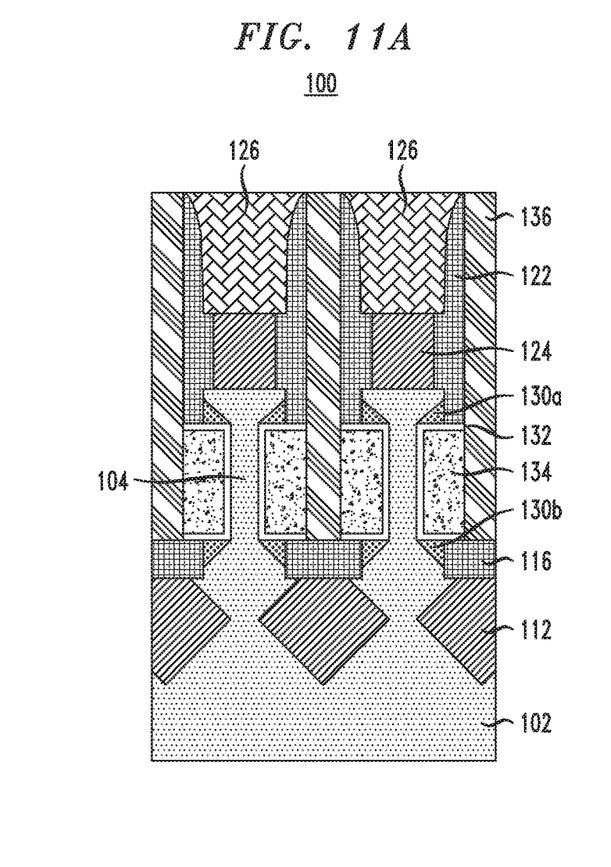
FIG. 11A is a cross sectional view of a semiconductor device through the fin width at an eleventh-intermediate fabrication stage, according to an illustrative embodiment.
Figure 11B:
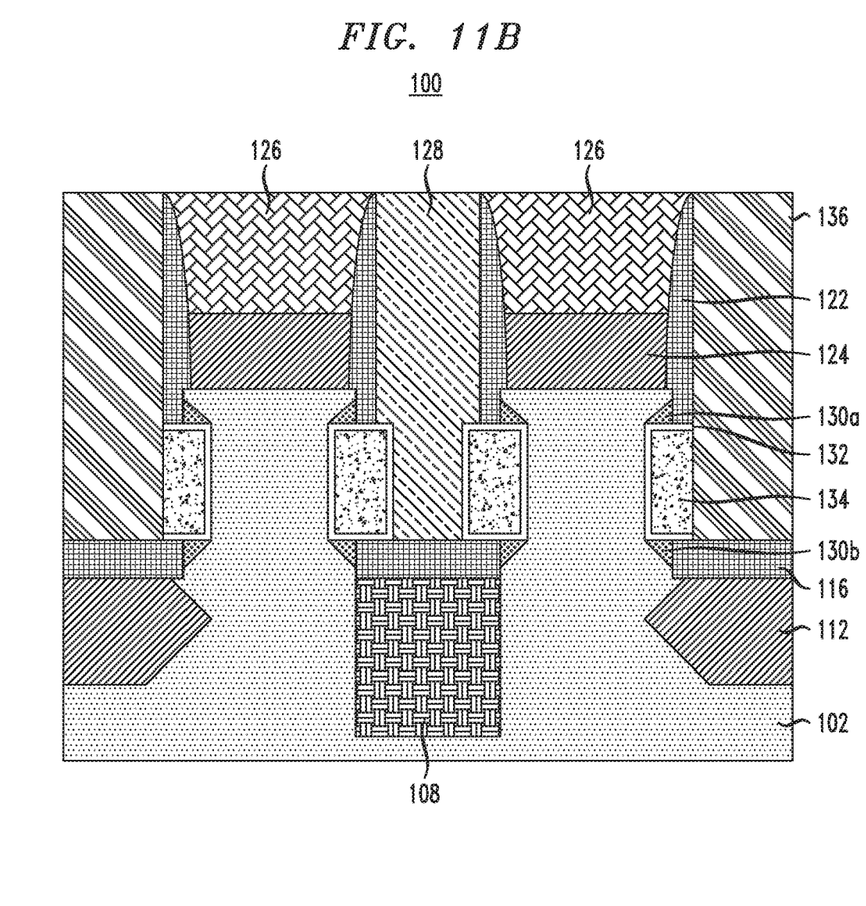
FIG. 11B is a cross sectional view of the semiconductor device of FIG. 11A through the fin length at the eleventh-intermediate fabrication stage, according to an illustrative embodiment.

FIG. 11A illustrates a cross-sectional view of semiconductor structure 100 through the fin width at an eleventh-intermediate fabrication stage, and FIG. 11B is a cross sectional view of the semiconductor device of FIG. 11A through the fin length at the eleventh-intermediate fabrication stage. During this stage, a gate dielectric layer 132 is deposited on the outer surfaces of fin 104, inner spacer 122, inner spacer layers 130a and 130b and bottom spacer layers 116. Gate dielectric layer 132 can be deposited by any conventional deposition technique including, for example, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), sputtering, or plating. In general, gate dielectric layer 132 is a thin film and can be formed from, for example, silicon oxide, silicon nitride, silicon oxynitride, boron nitride, SiOCN, SiBCN, SiOC, SiCN, high-k materials, or any combination of these materials. Examples of high-k materials include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material may further include dopants such as lanthanum, aluminum, magnesium.

Next, a work-function metal (WFM) layer 134 is deposited on the outer surfaces of gate dielectric layer 132 employing, for example, CVD, PECVD, RFCVD, PVD, ALD, MLD, MBD, PLD, liquid source misted chemical deposition (LSMCD), sputtering, or plating. Suitable material for WFM includes, for example, titanium nitride (TiN), tantalum nitride (TaN) or ruthenium (Ru) for a p-type FET (pFET), and TiN, titanium aluminum nitride (TiAlN), titanium aluminum carbon nitride (TiAlCN), titanium aluminum carbide (TiAlC), tantalum aluminum carbide (TaAlC), tantalum aluminum carbon nitride (TaAlCN) or lanthanum (La) doped TiN, and TaN and other appropriate metals and conducting metal layers (e.g., tungsten, cobalt, tantalum, aluminum, ruthenium, copper, metal carbides, and metal nitrides, or combinations thereof) for an n-type FET (nFET). Following deposition of WFM layer 134, a gate patterning and recess process will be performed to form gate dielectric layer 132 and WFM 134 shown in FIG. 11A and FIG. 11B. Since these processes are well-known to those of ordinary skill in the art, a detailed description of such processing is not described herein.

An ILD layer 136 is deposited in the outer portion of semiconductor structure 100 and in contact with the exterior surfaces of inner spacer layer 122, gate dielectric layer 132 and WFM layer 134 and the top surface of bottom spacer layers 116. ILD layer 136 can be any of the material discussed above for ILD layer 120, and deposited by similar techniques.

Figure 12A:
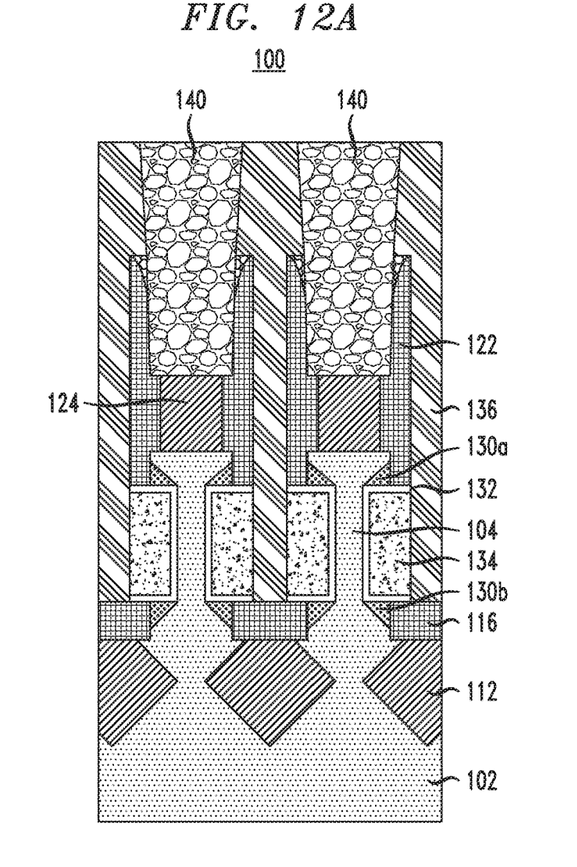
FIG. 12A is a cross sectional view of a semiconductor device through the fin width at a twelfth-intermediate fabrication stage, according to an illustrative embodiment.
Figure 12B:
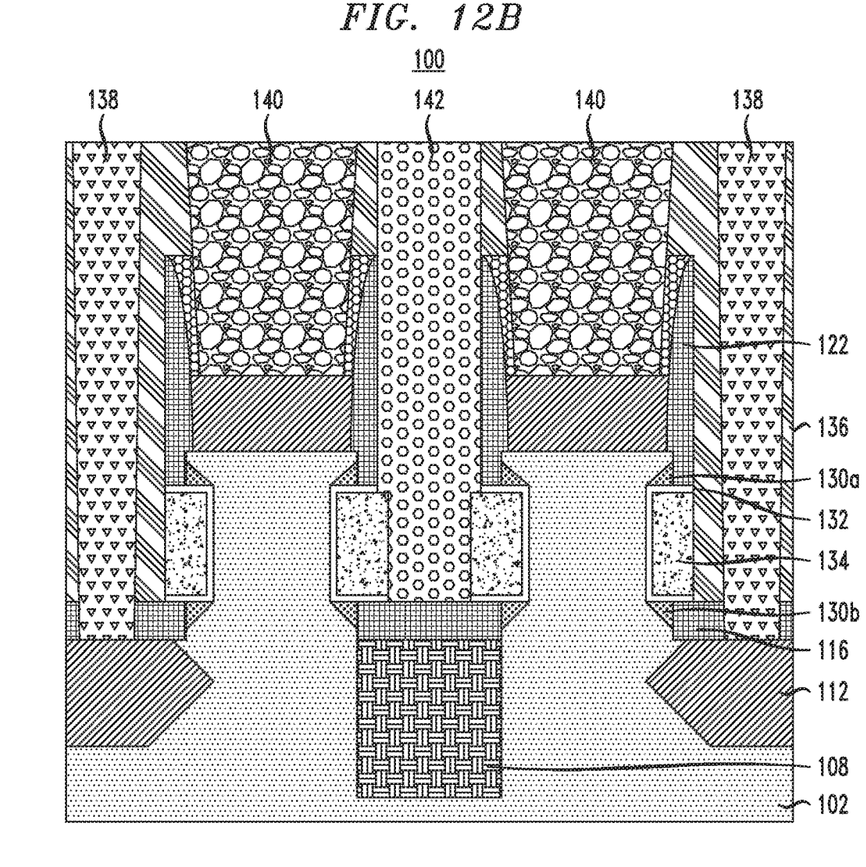
FIG. 12B is a cross sectional view of the semiconductor device of FIG. 12A through the fin length at the twelfth-intermediate fabrication stage, according to an illustrative embodiment.

FIG. 12A illustrates a cross-sectional view of semiconductor structure 100 through the fin width at a twelfth-intermediate fabrication stage, and FIG. 12B is a cross sectional view of the semiconductor device of FIG. 12A through the fin length at the twelfth-intermediate fabrication stage. During this stage, metal contacts including bottom source/drain contacts 138, top source/drain contacts 140, and metal gate contact 142 are formed. For example, bottom source/drain contacts 138 are an electrical contact that provides electrical connectivity to a bottom source/drain region. Top source/drain contacts 140 are electrical contacts that provide electrical connectivity to a top source/drain region. A circuit external to the VFET uses top source/drain contacts 140 to electrically connect a part of the circuit to a top source/drain region in a VET. Metal gate contact 142 is an electrical connection to a gate. A circuit external to the VFET uses metal gate contact 142 to electrically connect a part of the circuit to a gate in the VFET.

The metal contacts are formed by first forming conductive vias or trenches by methods known in the art, e.g., selectively etching through the ILD layer 136 by, for example, RIE, such that the via is communicative with the respective component, e.g., conductive vias or trenches for metal contacts 138 communicative with the respective bottom source/drain region 112. A conductive material is then deposited within the via. The conductive material for bottom source/drain contacts 138, top source/drain contacts 140, and metal gate contact 142 can be the same or different material. The conductive material can include any suitable conductive material such as, for example, polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. The depositing step may be followed by or accompanied with an annealing step.

It is to be further understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing embodiments of the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in art without departing from the scope or spirit of the invention.

What is claimed is:

1. A method for fabricating a semiconductor structure comprising:
    forming one or more vertical fins on a semiconductor substrate with a hardmask on a top surface of the one or more vertical fins;
    forming an opening in the hardmask and the one or more vertical fins and in a portion of the semiconductor substrate to form a plurality of vertical fins;
    depositing an anchor layer in the opening;
    depositing a liner layer on sidewalls of each of the vertical fins and above a top surface of the semiconductor substrate;
    forming an angled recessed region in the exposed portion of each of the vertical fins below the liner layer and in the semiconductor substrate;
    forming a bottom source/drain region in the angled recessed region;
    removing the liner layer;
    removing a portion of the anchor layer, wherein a top surface of the anchor layer is coplanar with a top surface of the bottom source/drain region; and
    forming a bottom spacer layer on top surfaces of the anchor layer and the bottom source/drain region.

2. The method of claim 1, wherein the anchor layer is an oxide material.

3. The method of claim 1, further comprising:
    forming a dummy gate on the sidewalls of each of the vertical fins;
    depositing a first interlevel dielectric material on the semiconductor substrate and the dummy gate; and
    removing the hardmask.

4. The method of claim 3, further comprising:
    recessing the dummy gate to below a top surface of each of the vertical fins; and
    forming a first inner spacer on the sidewalls above a top surface of the recessed dummy gate.

5. The method of claim 4, further comprising:
    forming a top source/drain region on the top surface of each of the vertical fins; and
    depositing a cap layer on the top source/drain region.

6. The method of claim 5, further comprising:
    removing the first interlevel dielectric material in the opening between each of the vertical fins; and
    depositing another dielectric material in the opening, wherein the other dielectric material is different than the first interlevel dielectric material.

7. The method of claim 6, further comprising:
    removing the first interlevel dielectric material from outer portions of the semiconductor structure;
    removing the dummy gate; and trimming a central portion of each of the fins to form a first gap between the first inner spacer and a top portion of each of the vertical fins and a second gap between the bottom spacer layer a lower portion of each of the vertical fins.

8. The method of claim 7, further comprising:
depositing a second inner spacer layer in the first gap between the first inner spacer and a top portion of each of the vertical fins; and
depositing a third inner spacer in the second gap between the bottom spacer layer a lower portion of each of the vertical fins, wherein the second inner spacer layer is coplanar with a bottom surface of the first inner spacer and the third inner spacer layer is coplanar with a top surface of the bottom spacer layer.

9. The method of claim 8, further comprising:
forming a metal gate in an area defined between the second inner layer and the third inner layer.

10. The method of claim 9, wherein the metal gate comprises a high k dielectric material.

11. The method of claim 10, wherein the metal gate further comprises a work-function metal.

12. The method of claim 9, further comprising:
forming a first metal contact to provide electrical contact with the bottom source/drain region;
forming a second metal contact to provide electrical contact with the top source/drain region; and
forming a third metal contact to provide electrical contact with the metal gate.

13. The method of claim 1, wherein the angled recess region is sigma-shaped.

14. The method of claim 6, wherein the other dielectric material comprises silicon carbide.

15. The method of claim 1, wherein the semiconductor substrate and each of the vertical fins comprises silicon.

16. The method of claim 1, wherein the bottom source/drain region is an epitaxially grown bottom source/drain region.

17. The method of claim 5, wherein the top source/drain region is an epitaxially grown top source/drain region.

18. A semiconductor structure comprising:
a plurality of vertical fins on a semiconductor substrate, wherein each of the vertical fins have a top portion, a central portion and a bottom portion, and further wherein a thickness of the top portion and the bottom portion is greater than a thickness of the central portion;
a shallow trench region comprising an anchor material disposed between adjacent vertical fins having a first bottom spacer layer on a top surface thereof;
a bottom source/drain region disposed in an angled recess region in an outer portion of the bottom portion of each of the adjacent vertical fins and in the semiconductor substrate;
a second bottom spacer layer disposed on a portion of a top surface of bottom source/drain region;
a replacement metal gate disposed on a portion of first and second bottom spacer layers and in contact with the central portion of each of the vertical fins;
a top source drain region disposed on a top surface of each of the vertical fins;
an inner spacer disposed on a portion of a top surface of the replacement metal gate and in contact with a portion of top portion of each of the vertical fins and sidewalls of the top source drain region;
an interlevel dielectric layer disposed on a top surface of the second bottom spacer layers and in contact with sidewalls of the replacement metal gate and the inner spacer and above a top surface of the inner spacer; and
metal contacts to electrically couple respectively with the replacement metal gate, the top source/drain region, and the bottom source/drain region.

19. The semiconductor structure of claim 18, wherein the anchor layer is an oxide material.

20. An integrated circuit comprising:
one or more semiconductor structures, wherein at least one of the semiconductor structures comprises:
a plurality of vertical fins on a semiconductor substrate, wherein each of the vertical fins have a top portion, a central portion and a bottom portion, and further wherein a thickness of the top portion and the bottom portion is greater than a thickness of the central portion;
a shallow trench region comprising an anchor material disposed between adjacent vertical fins having a first bottom spacer layer on a top surface thereof;
a bottom source/drain region disposed in an angled recess region in an outer portion of the bottom portion of each of the adjacent vertical fins and in the semiconductor substrate;
a second bottom spacer layer disposed on a portion of a top surface of bottom source/drain region;
a replacement metal gate disposed on a portion of first and second bottom spacer layers and in contact with the central portion of each of the vertical fins;
a top source drain region disposed on a top surface of each of the vertical fins;
an inner spacer disposed on a portion of a top surface of the replacement metal gate and in contact with a portion of top portion of each of the vertical fins and sidewalls of the top source drain region;
an interlevel dielectric layer disposed on a top surface of the second bottom spacer layers and in contact with sidewalls of the replacement metal gate and the inner spacer and above a top surface of the inner spacer; and
metal contacts to electrically couple respectively with the replacement metal gate, the top source/drain region, and the bottom source/drain region.

* * * * *